United States Patent
Pattanayak et al.

(10) Patent No.: US 8,883,580 B2
(45) Date of Patent: Nov. 11, 2014

(54) TRENCH METAL OXIDE SEMICONDUCTOR WITH RECESSED TRENCH MATERIAL AND REMOTE CONTACTS

(71) Applicant: Vishay-Siliconix, Santa Clara, CA (US)

(72) Inventors: Deva N. Pattanayak, Saratoga, CA (US); Kyle Terrill, Santa Clara, CA (US); Sharon Shi, San Jose, CA (US); Misha Lee, San Jose, CA (US); Yuming Bai, Union City, CA (US); Kam Lui, Santa Clara, CA (US); Kuo-in Chen, Los Altos, CA (US)

(73) Assignee: Vishay-Siliconix, Santa Clara, CA (US)

( * ) Notice: Subject to any disclaimer, the term of this patent is extended or adjusted under 35 U.S.C. 154(b) by 66 days.

(21) Appl. No.: 13/728,997

(22) Filed: Dec. 27, 2012

(65) Prior Publication Data

US 2014/0235023 A1 Aug. 21, 2014

Related U.S. Application Data

(62) Division of application No. 12/098,950, filed on Apr. 7, 2008, now Pat. No. 8,368,126.

(60) Provisional application No. 60/925,237, filed on Apr. 19, 2007.

(51) Int. Cl.
*H01L 21/338* (2006.01)
*H01L 29/66* (2006.01)

(52) U.S. Cl.
USPC .......................................... 438/167; 257/260

(58) Field of Classification Search
USPC .............. 257/54, 73, 260, 280, 449; 438/167, 438/570
See application file for complete search history.

(56) References Cited

U.S. PATENT DOCUMENTS

| 4,642,674 A | 2/1987 | Schoofs |
| 4,663,644 A | 5/1987 | Shimizu |

(Continued)

FOREIGN PATENT DOCUMENTS

| DE | 10239310 | 3/2004 |
| EP | 0133642 | 6/1985 |

(Continued)

OTHER PUBLICATIONS

H Yilmaz et al., Insulated gate Transistor Modeling and Optimization, 1984, pp. 274-277 IEDM.

(Continued)

*Primary Examiner* — Calvin Lee (57) ABSTRACT

Remote contacts to the polysilicon regions of a trench metal oxide semiconductor (MOS) barrier Schottky (TMBS) device, as well as to the polysilicon regions of a MOS field effect transistor (MOSFET) section and of a TMBS section in a monolithically integrated TMBS and MOSFET (SKYFET) device, are employed. The polysilicon is recessed relative to adjacent mesas. Contact of the source metal to the polysilicon regions of the TMBS section is made through an extension of the polysilicon to outside the active region of the TMBS section. This change in the device architecture relieves the need to remove all of the oxides from both the polysilicon and silicon mesa regions of the TMBS section prior to the contact step. As a consequence, encroachment of contact metal into the sidewalls of the trenches in a TMBS device, or in a SKYFET device, is avoided.

6 Claims, 7 Drawing Sheets

(56) References Cited

U.S. PATENT DOCUMENTS

| | | |
|---|---|---|
| 4,680,604 A | 7/1987 | Nakagawa et al. |
| 4,760,431 A | 7/1988 | Nakagawa et al. |
| 4,774,198 A | 9/1988 | Contiero et al. |
| 4,775,879 A | 10/1988 | Robb et al. |
| 4,777,521 A | 10/1988 | Coe |
| 4,779,123 A | 10/1988 | Bencuya et al. |
| 4,837,606 A | 6/1989 | Goodman et al. |
| 4,916,085 A | 4/1990 | Frisina |
| 5,136,349 A | 8/1992 | Yilmaz et al. |
| 5,326,711 A | 7/1994 | Malhi |
| 5,473,176 A | 12/1995 | Kakumoto |
| 5,648,283 A | 7/1997 | Tsang et al. |
| 5,742,076 A | 4/1998 | Sridevan et al. |
| 5,760,440 A | 6/1998 | Kitamura et al. |
| 5,764,206 A | 6/1998 | Koyama et al. |
| 5,770,514 A | 6/1998 | Matsuda et al. |
| 5,864,158 A | 1/1999 | Liu et al. |
| 5,866,931 A | 2/1999 | Bulucea et al. |
| 5,929,481 A | 7/1999 | Hshieh et al. |
| 5,998,833 A | 12/1999 | Baliga |
| 6,049,108 A | 4/2000 | Williams et al. |
| 6,057,558 A | 5/2000 | Yamamoto et al. |
| 6,133,587 A | 10/2000 | Takeuchi et al. |
| 6,211,018 B1 | 4/2001 | Nam et al. |
| 6,246,090 B1 | 6/2001 | Brush et al. |
| 6,319,777 B1 | 11/2001 | Hueting et al. |
| 6,346,438 B1 | 2/2002 | Yagishita et al. |
| 6,351,018 B1 | 2/2002 | Sapp |
| 6,407,435 B1 | 6/2002 | Ma et al. |
| 6,413,822 B2 | 7/2002 | Williams et al. |
| 6,511,885 B2 | 1/2003 | Harada et al. |
| 6,627,950 B1 | 9/2003 | Bulucea et al. |
| 6,649,975 B2 | 11/2003 | Baliga |
| 6,737,704 B1 | 5/2004 | Takemori et al. |
| 6,764,889 B2 | 7/2004 | Baliga |
| 6,797,588 B2 | 9/2004 | Ishikawa et al. |
| 6,838,730 B1 * | 1/2005 | Kawaguchi et al. .......... 257/331 |
| 6,891,223 B2 | 5/2005 | Krumrey et al. |
| 6,906,380 B1 | 6/2005 | Pattanayak et al. |
| 6,919,248 B2 | 7/2005 | Francis et al. |
| 6,974,750 B2 | 12/2005 | Haase |
| 6,987,305 B2 | 1/2006 | He et al. |
| 7,005,347 B1 | 2/2006 | Bhalla et al. |
| 7,186,609 B2 | 3/2007 | Korec et al. |
| 7,279,743 B2 | 10/2007 | Pattanayak et al. |
| 7,344,945 B1 | 3/2008 | Pattanayak et al. |
| 7,361,558 B2 | 4/2008 | Pattanayak et al. |
| 7,833,863 B1 | 11/2010 | Pattanayak et al. |
| 8,368,126 B2 * | 2/2013 | Pattanayak et al. .......... 257/260 |
| 2001/0003367 A1 | 6/2001 | Hshieh et al. |
| 2001/0023959 A1 | 9/2001 | Harada et al. |
| 2002/0019099 A1 | 2/2002 | Williams et al. |
| 2002/0125528 A1 | 9/2002 | Kawaguchi et al. |
| 2003/0001203 A1 | 1/2003 | Ono et al. |
| 2003/0006456 A1 | 1/2003 | Takahashi et al. |
| 2003/0008460 A1 | 1/2003 | Darwish |
| 2003/0062570 A1 | 4/2003 | Darwish et al. |
| 2003/0178673 A1 | 9/2003 | Bhalla et al. |
| 2004/0145011 A1 | 7/2004 | Hsu et al. |
| 2004/0195618 A1 | 10/2004 | Saito et al. |
| 2005/0167748 A1 | 8/2005 | Onda et al. |
| 2005/0199918 A1 * | 9/2005 | Calafut et al. ............. 257/260 |
| 2005/0287744 A1 * | 12/2005 | Ono et al. .................... 438/270 |
| 2006/0273390 A1 | 12/2006 | Hshieh et al. |
| 2009/0079002 A1 | 3/2009 | Lee et al. |

FOREIGN PATENT DOCUMENTS

| | | |
|---|---|---|
| EP | 1168455 A2 | 1/2002 |
| EP | 1170803 | 1/2002 |
| JP | 57-206073 | 12/1982 |
| JP | 62-039069 | 2/1987 |
| JP | 63-252480 | 10/1988 |
| JP | 64-769 | 1/1989 |
| JP | 2006-012967 | 12/2006 |

OTHER PUBLICATIONS

Victor A.K. Temple, MOS-Controlled Thyristors—A New Class of Power Devices, Oct. 1986, pp. 1609-1618, IEEE, vol. ED-33, No. 10.

H. Yilmaz, Cell Geometry Effect on IGT Latch-Up, IEEE Electron Device Letters, vol. EDL-6, No. 8, Aug. 1985.

* cited by examiner

TRENCH METAL OXIDE SEMICONDUCTOR WITH RECESSED TRENCH MATERIAL AND REMOTE CONTACTS

RELATED U.S. APPLICATIONS

This application is a continuation (divisional) of and claims priority to the patent application with Ser. No. 12/098,950, filed on Apr. 7, 2008 now U.S. Pat. No. 8,368,126 issused Feb. 5, 2013, entitled "Trench Metal Oxide Semiconductor with Recessed Trench Material and Remote Contacts," which in turn claims priority to the provisional patent application, Ser. No. 60/925,237, entitled "Trench Metal Oxide Semiconductor with Recessed Trench Material and Remote Contacts," with filing date Apr. 19, 2007, assigned to the assignee of the present application, and hereby incorporated by reference in their entirety.

FIELD OF THE INVENTION

Embodiments in accordance with the present invention generally pertain to semiconductor devices.

BACKGROUND

In a trench metal oxide semiconductor (MOS) barrier Schottky (TMBS) device, polysilicon is contained inside a trench that is formed in a silicon substrate. The polysilicon inside the trench and the silicon mesa (the surface between adjacent trenches) are connected locally using a metal contact.

In a monolithically integrated TMBS and MOS field effect transistor (MOSFET) device, which may be referred to herein as a SKYFET device, polysilicon is contained inside a trench that is formed in a silicon substrate. The source of the MOSFET section and the TMBS section are connected by the same contact metal.

In both of these types of devices, the polysilicon is separated from the sidewalls of the trench by an oxide layer. During fabrication, a portion of the oxide layer and a portion of the polysilicon are etched away prior to deposition of the contact metal. Unfortunately, the etch process can result in the encroachment of the metal into the sidewalls of the trench (into the mesa), resulting in excessive current leakage often attributed as edge leakage in Schottky diode technology.

SUMMARY

A method and/or device that that eliminates or reduces edge leakage in TMBS and SKYFET devices would be advantageous. Embodiments in accordance with the present invention provide this and other advantages.

Embodiments in accordance with the present invention resolve the problem of edge leakage by employing remote contacts to the polysilicon regions of a TMBS device, as well as to the polysilicon regions of a MOSFET section and a TMBS section of a SKYFET device.

Contact of the source metal to the polysilicon regions of the TMBS section is made through an extension of the polysilicon to outside the TMBS section. The polysilicon is recessed relative to adjacent mesas and isolated from the contact metal by an oxide layer. These changes in device architecture relieve the need to remove all of the oxides from both the polysilicon and silicon mesa regions of the TMBS section prior to deposition of the contact metal. As a consequence, encroachment of contact metal into the sidewalls of the trenches in a TMBS device, or in a SKYFET device, is avoided.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "etching" or the like, refer to actions and processes (e.g., flowchart 100 of FIG. 1) of semiconductor device fabrication.

The figures are not drawn to scale, and only portions of the structures, as well as the various layers that form those structures, may be shown. Furthermore, other fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) processes and steps without significantly perturbing them. Generally speaking, embodiments in accordance with the present invention can replace portions of a conventional process without significantly affecting peripheral processes and steps.

Figure 1:
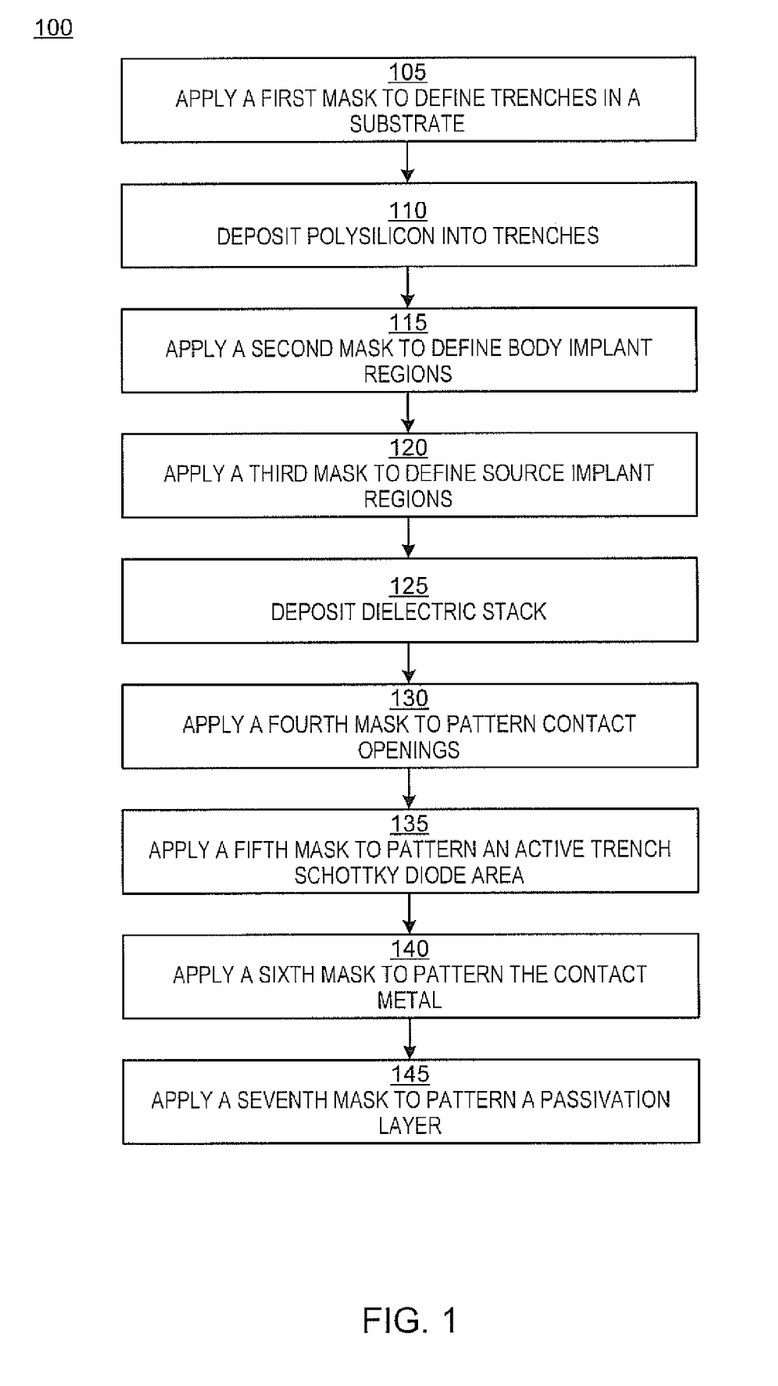
FIG. 1 is a flowchart of a process that is used in the fabrication of a semiconductor device according to one embodiment of the present invention.

FIG. 1 is a flowchart 100 of one embodiment of a process that is used in the fabrication of a semiconductor device, specifically a monolithically integrated TMBS and MOSFET device, or SKYFET. Although the process of flowchart 100 is described in the context of a SKYFET such as that shown in FIG. 10, a subset of the process can be utilized to form only a TMBS device such as that shown in FIG. 11 (that is, only the steps used to form the TMBS section of a SKYFET may be performed, in which case the steps used to form the MOSFET section are not necessarily performed).

Although specific steps are disclosed in FIG. 1, such steps are exemplary. That is, the present invention is well suited to performing various other steps or variations of the steps recited in FIG. 1. FIG. 1 is discussed in conjunction with FIGS. 2 through 9, which are cross-sectional views showing selected stages in the fabrication of a semiconductor device according to an embodiment of the present invention, and also in conjunction with FIGS. 10 and 11, which are top-down views of portions of embodiments of semiconductor devices that can be manufactured using the process of flowchart 100.

Figure 2:
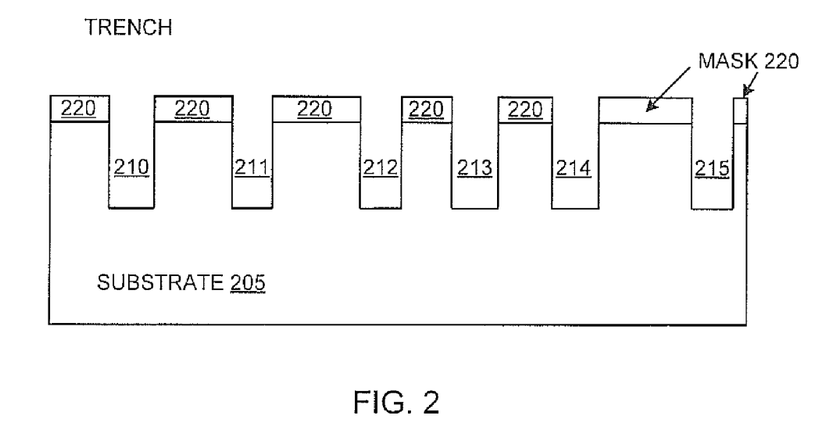
FIGS. 2, 3, 4, 5, 6, 7, 8 and 9 are cross-sectional views showing selected stages in the fabrication of a semiconductor device according to embodiments of the present invention.

In block 105 of FIG. 1, with reference also to FIG. 2, a first mask 220 (e.g., photoresist) is patterned onto substrate 205 (e.g., a p-type silicon substrate) in order to define trenches such as trenches 210, 211, 212, 213, 214 and 215. The trenches 210-215 are formed by etching the substrate 205 in areas not covered by the mask 220. Trench 215, which may be used as a channel stopper (e.g., its contents may later be doped with an n-type impurity), is optional. After the trenches are formed, the mask 220 is removed and the resulting structure is cleaned. Etching and sacrificial oxidation may follow the cleaning to improve trench sidewall quality.

Figure 3:
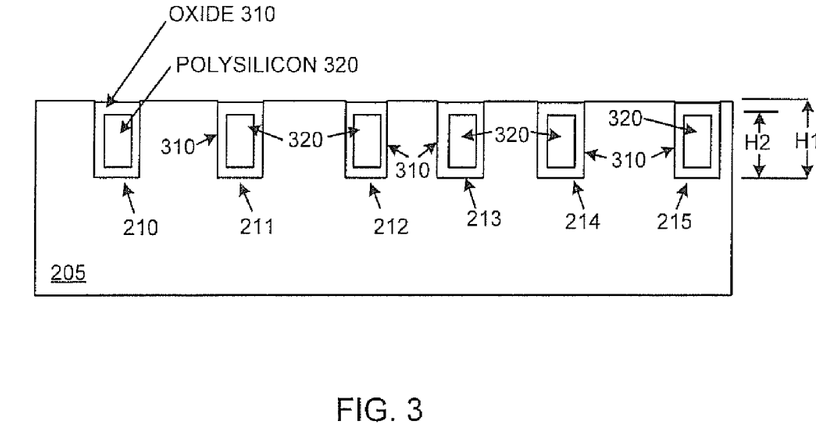

In block 110 of FIG. 1, with reference also to FIG. 3, a gate oxide layer 310 is grown in each of the trenches 210-215, and polysilicon 320 is deposited into each of the trenches 210-215. These steps may be followed by doping, blanket etch back, and polysilicon re-oxidation. Significantly, the top surfaces of the regions of polysilicon 320 are recessed relative to the tops of the trenches 210-215. More specifically, the sidewalls of the trenches (or, correspondingly, the sidewalls of the mesas) have a height H1, while the polysilicon 320 is deposited within the trenches to a height H2, where H2 is less than H1.

Figure 4:
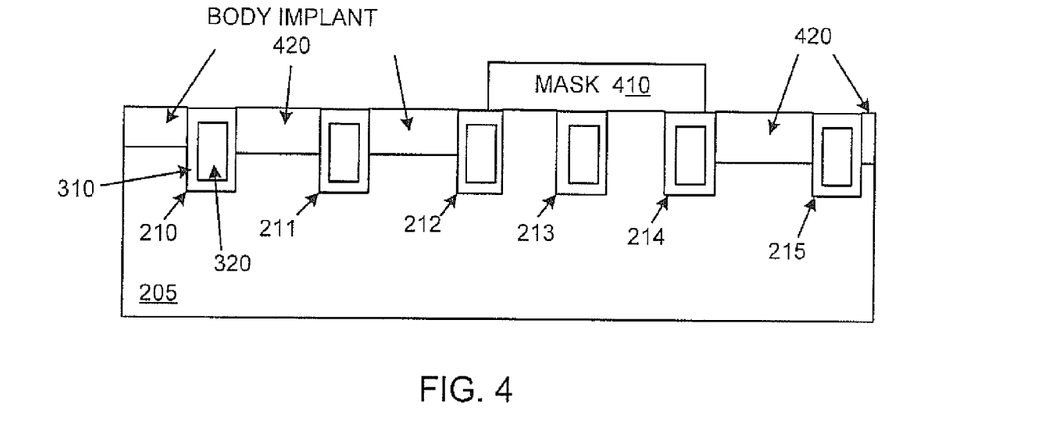

In block 115 of FIG. 1, with reference also to FIG. 4, a second mask 410 is applied to define regions in which a body implant 420 (e.g., a p-body implant) is subsequently admitted. The mask 410 can then be stripped, the resulting structure can be cleaned, and the body implant 420 can be annealed and diffused to the desired junction depth.

Figure 5:
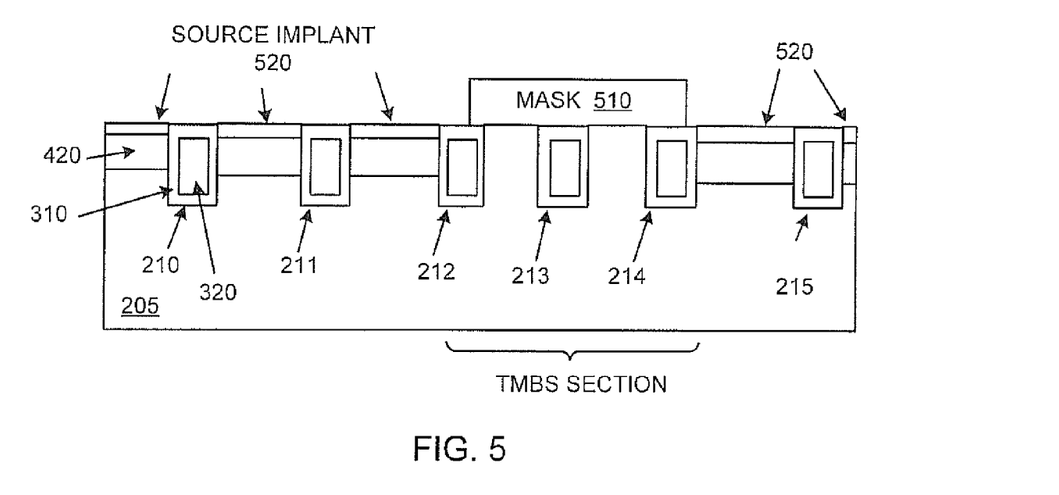

In block 120 of FIG. 1, with reference also to FIG. 5, a third mask 510 is applied to define regions in which a source implant 520 (e.g., an n$^+$ source implant) is subsequently admitted. Significantly, the source implant 520 is not admitted into either the termination areas around the trenches 212 and 214 or the regions between the trenches 212-214, which correspond to the active region of a TMBS section of a SKYFET. The source implant 520 is permitted into the optional channel stopper (trench 215). The mask 510 can then be stripped and the resulting structure can be cleaned.

Figure 6:
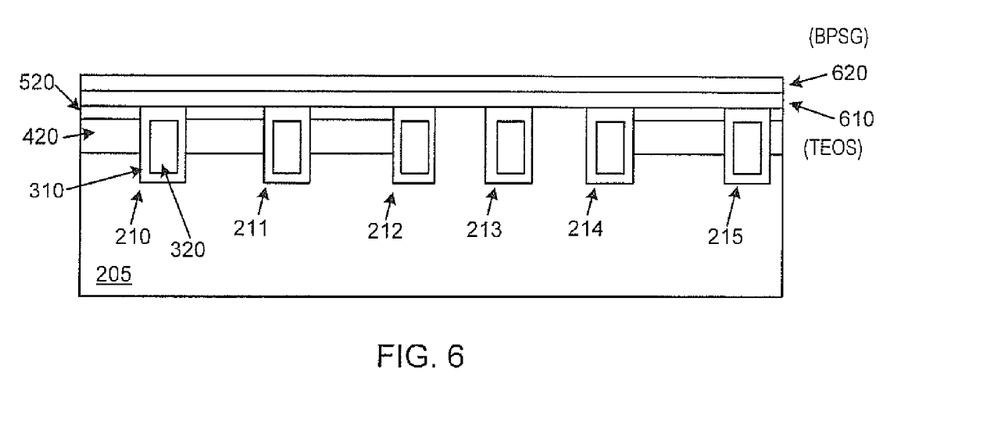

In block 125 of FIG. 1, with reference also to FIG. 6, a dielectric stack is deposited across the entire surface of the structure and densified. In one embodiment, the dielectric stack includes a layer 610 of tetraethylorthosilicate (TEOS) and a layer 620 of borophosphosilicate glass (BPSG).

Figure 7:
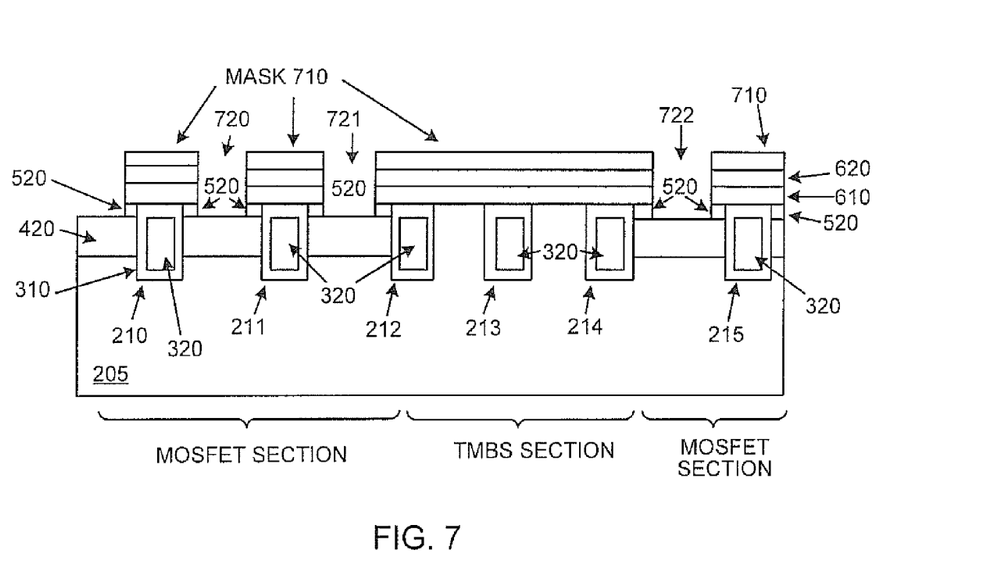

In block 130 of FIG. 1, with reference also to FIG. 7, a fourth mask 710 is applied to define the contact openings 720, 721 and 722 in the active region of the MOSFET section(s) of the SKYFET. Because, prior to the etch, the upper surface of the structure is relatively flat, a thinner resist mask can be used. The source implant layer 520, the TEOS layer 610 and the BPSG layer 620 are etched, except for the areas under the mask 710, to form the contact openings 720-722. Significantly, the active area of the TMBS section is masked by mask 710.

When contact metal is deposited in a subsequent step (block 140), the contact openings 720-722 permit contact between the n-type implants (layer 520) and the contact metal; however, the contact metal will not contact the regions of polysilicon 320. That is, the same metal does not contact both the source implants 520 and the polysilicon 320.

Importantly, the sidewalls of the trenches 210-215 are not exposed to the etch used to form the contact openings 720-722, thus avoiding the problem of encroachment of the contact metal (deposited in block 140) into the sidewalls of the trenches 210-215 and thereby eliminating or reducing edge leakage often attributed to such metal encroachment.

Figure 10:
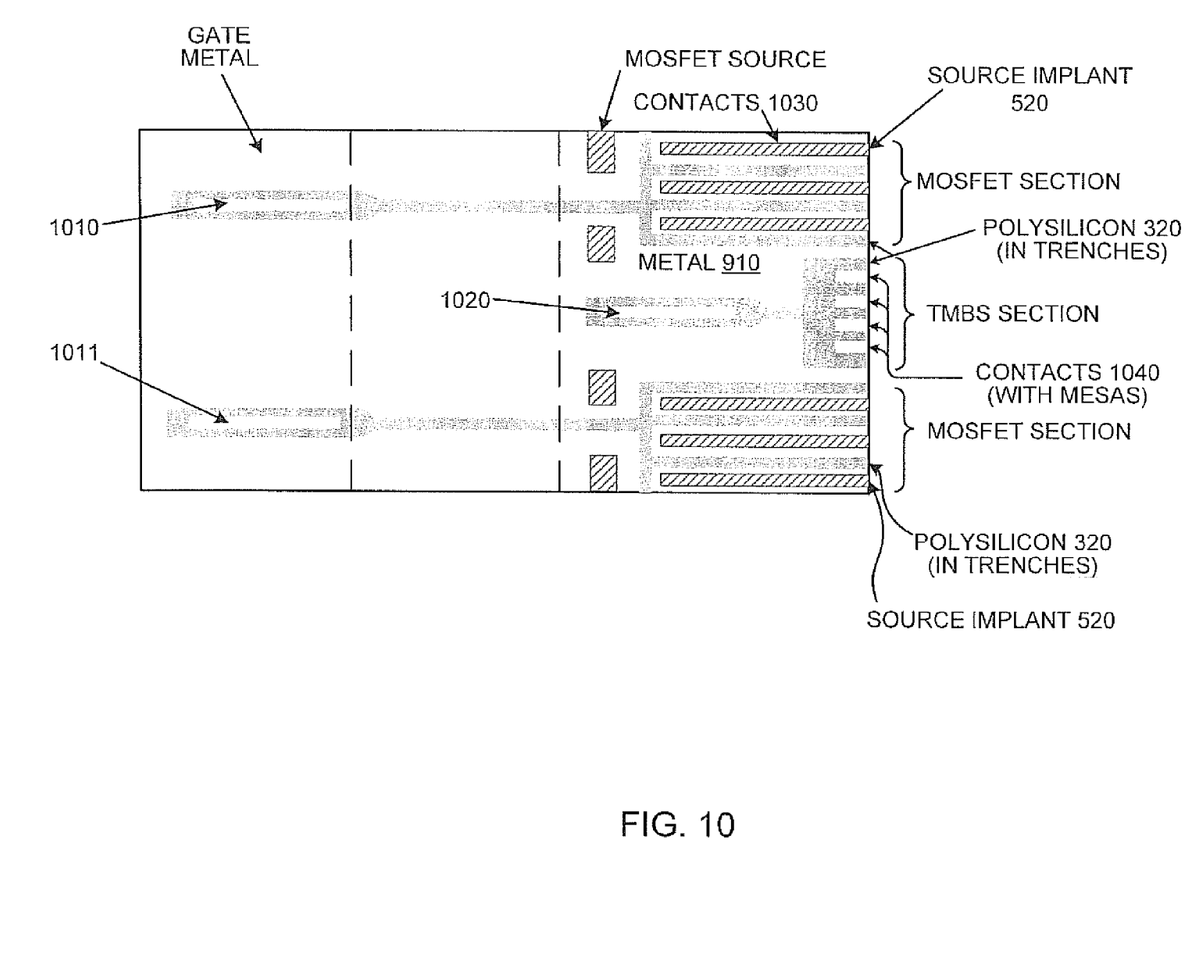
FIG. 10 is a top-down view showing elements of a semiconductor device that includes MOSFET and TMBS sections according to one embodiment of the present invention.
Figure 11:
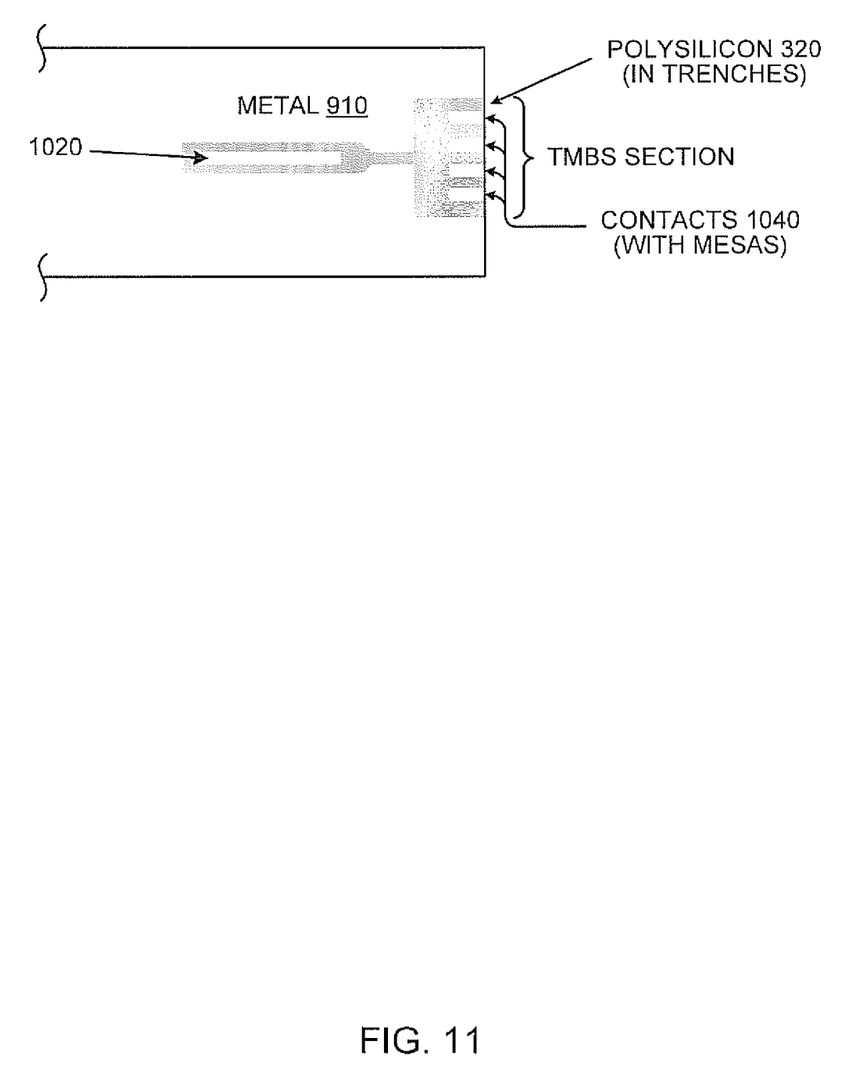
FIG. 11 is a top-down view showing elements of a semiconductor device that includes a TMBS section according to one embodiment of the present invention.

With reference also to FIGS. 10 and 11, in order to contact the regions of polysilicon 320, the fourth mask 710 also defines contact openings in the gate pickup area (e.g., contacts 1010 and 1011) and in the polysilicon pickup area of the TMBS section (e.g., contact 1020). From the perspective of FIG. 7, for example, the polysilicon regions 320 extend a distance into the page, as shown in FIGS. 10 and 11. The contacts 1010 and 1011 contact the polysilicon 320 that is in the MOSFET section, and the contact 1020 contacts the polysilicon 320 that is in the TMBS section.

After contact oxide etches and a silicon etch, contact clamping implant and shallow contact implant are performed and the fourth mask 710 can be stripped. The contact clamping and shallow contact implants improve the contact resistance to the body and also shift avalanche breakdown from the trenches to the center of each mesa.

After the mask 710 is stripped, the resulting structure can then be subjected to high temperature reflow in order to activate the contact implant, activate the source implant if it has not be activated, drive the source implant to its target junction depth, densify the dielectric stack if needed, and contour the dielectric stack if desired in order to soften the topography of the structure.

Figure 8:
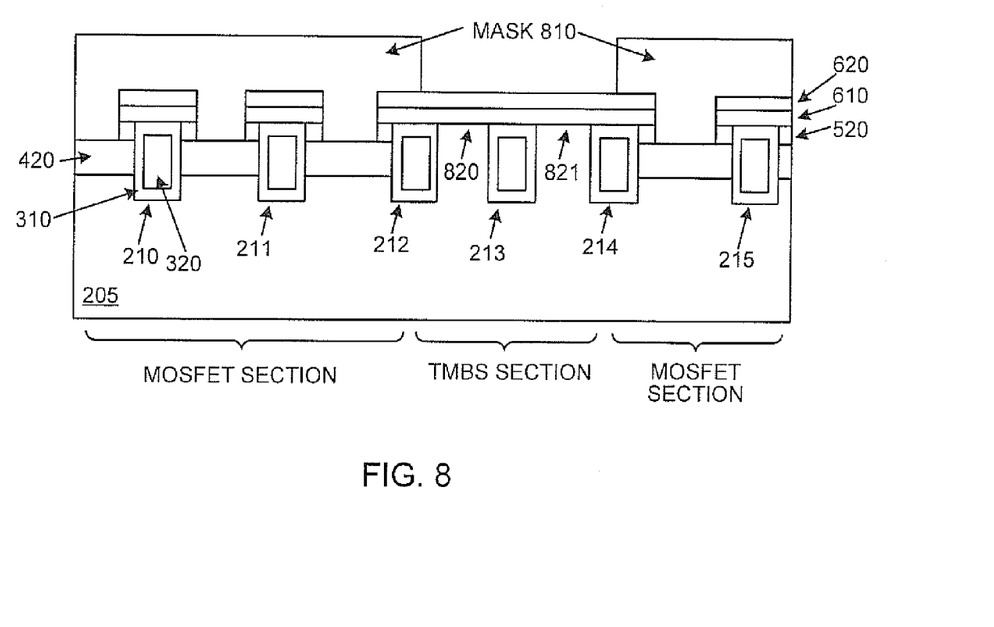

In block 135 of FIG. 1, with reference also to FIG. 8, a fifth mask 810 is used to pattern only the active area of the TMBS section, in order to etch away portions of the dielectric stack (e.g., TEOS layer 610 and BPSG layer 620) prior to deposition of barrier and contact metal. In one embodiment, after etching of the dielectric stack, any remaining oxide layered on the surfaces of the mesas in the TMBS section (e.g., mesas 820 and 821) is cleaned from those surfaces. In one embodiment, the oxide on the TMBS mesa surfaces is dry etched to a thickness of approximately 1000 Angstroms, and then a buffered oxide etch (BOE) (e.g., a 9:1 BOE wet dip) is applied to remove any remaining oxide, so that good contact can be made between the mesa surfaces and the contact metal (deposited in block 140). An objective of the wet overetch is to clean the oxide from the TMBS mesa surfaces, but not necessarily from inside the trenches 212-214. Significantly, the top surface of the polysilicon 320 in trenches 212-214 remains recessed relative to the mesa surfaces 820-821, covered by a remaining thickness of the gate oxide layer 310.

Figure 9:
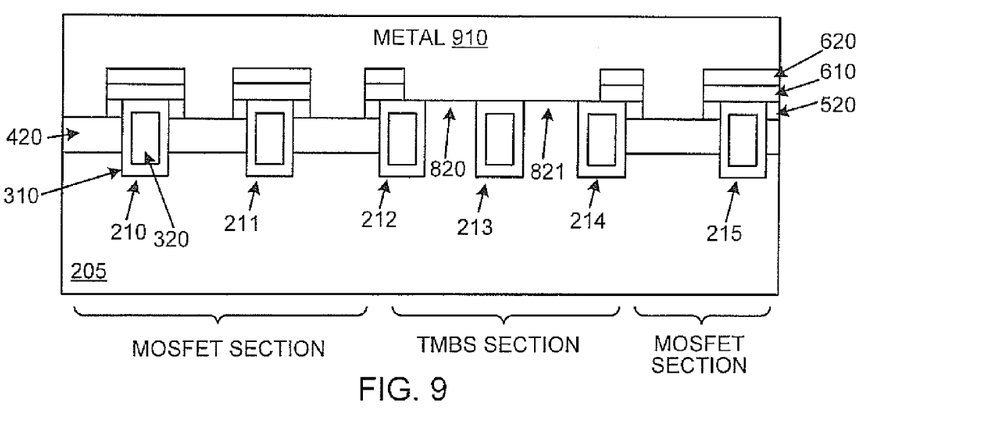

In block 140 of FIG. 1, with reference also to FIG. 9, a source metal layer 910 is formed. More specifically, barrier and contact metal (e.g., titanium nitride, titanium, aluminum)

is deposited to form the layer 910. The deposited metal can be subsequently patterned using a sixth mask (not shown). The source metal layer 910 contacts the TMBS mesas 820-821 but not the regions of polysilicon 320. That is, the source metal layer 910 is isolated from the polysilicon 320 by the oxide 310.

In block 145 of FIG. 1, a passivation layer, if used, can be deposited and patterned using a seventh mask (not shown). The structure can then be ground and back metal can be applied.

A device that includes only a TMBS section can be formed by skipping the steps described in blocks 115, 120 and 130, for example.

Refer now to FIGS. 10 and 11, which show a top down view of a portion of a SKYFET device (including MOSFET sections and a TMBS section) and a similar view of a TMBS device, respectively, according to embodiments of the invention. In the example of FIG. 10, the different regions of polysilicon 320 in the trenches of each MOSFET section are connected to each other and then to contacts 1010 and 1011 outside the active regions of the MOSFET section(s). Given the orientation of FIG. 10, the polysilicon 320 extends to the contacts 1010 and 1011, which are each beyond the edge of the source metal layer 910 that is disposed over the trenches 210-211 and 215 (FIG. 2) in the MOSFET sections that contain the polysilicon 320. Thus, electrical contact between the MOSFET polysilicon 320 and the gate metal is made via the contacts 1010 and 1011. However, contacts 1010 and 1011 are outside the active region of the MOSFET sections shown in FIG. 10. That is, contacts 1010 and 1011 are outside the region of the source metal layer 910 that lies over the trenches in the MOSFET sections that contain the polysilicon 320.

Similarly, the different regions of polysilicon 320 in the trenches of each TMBS section are connected to each other and then to contact 1020, which is outside the active TMBS section of FIGS. 10 and 11. Given the orientation of FIGS. 10 and 11, the polysilicon 320 extends further than the mesas 820-821 (FIG. 8) in the lateral direction. The source metal layer 910 is disposed over the trenches 212-214 (FIG. 2) in the TMBS section that contain the polysilicon 320 and the mesas between those trenches.

As mentioned above, the source metal layer 910 is in electrical contact with the mesas but is isolated from the polysilicon 320 in the trenches. Contacts 1040 represent the connections between the Schottky contact metal (source metal Layer 910) and the mesas 820-821 (FIG. 8) in the TMBS section of FIG. 10. Electrical contact between the polysilicon 320 and the source metal layer 910 is made via the contact 1020. However, contact 1020 is outside the active region of the TMBS section shown in FIGS. 10 and 11. That is, contact 1020 is outside the region of the source metal layer 910 that lies over the trenches in the TMBS section that contain the polysilicon 320 and that also lies over the mesas between those trenches.

Also shown are MOSFET source contacts 1030 that provide electrical contact to the source implants 520 (FIG. 7).

In summary, embodiments in accordance with the present invention resolve the problem of excessive leakage by employing remote contacts (e.g., contact 1020) to the polysilicon regions of a TMBS device, as well as to the polysilicon regions of TMBS section(s) and MOSFET section(s) of a SKYFET device. The polysilicon 320 is recessed relative to adjacent mesas. A stacked layer of TEOS 610 and BPSG 620 (FIG. 6) is employed to selectively leave a thin layer of oxide on top of the polysilicon 320 while making sure that the mesa surfaces in the TMBS section (e.g., mesas 820-821) are open for contact metal, but without exposing trench sidewalls to etching.

These changes in the device architecture relieve the need to remove all of the oxides from both the polysilicon and silicon mesa regions of the TMBS section prior to the contact step. Oxide is etched completely only from the silicon mesas in the TMBS section. Contact of the source metal to the polysilicon regions of the TMBS section is made through an extension of the polysilicon to outside the TMBS section. As a consequence of these features as well as the process used to fabricate these features, encroachment of contact metal into the sidewalls of the trenches in a TMBS device, or in a SKYFET device, is avoided.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a semiconductor device comprising a trench metal oxide semiconductor (MOS) barrier Schottky (TMBS) device, said method comprising:
    forming a plurality of first trenches separated by mesas, said first trenches having sidewalls of a first height;
    depositing conductive material within said first trenches to a height that is less than said first height;
    forming a layer of insulating material over said conductive material;
    forming a source metal layer over a first region that encompasses said first trenches and said mesas, wherein within said first region, said source metal layer is separated from said conductive material by said insulating material; and
    forming a first electrical contact between said source metal layer and said conductive material in said first trenches, wherein said first electrical contact is outside of said first region.

2. The method of claim 1 wherein said insulating material comprises a gate oxide, said substrate comprises a p-type silicon substrate, said conductive material comprises polysilicon, and said source metal layer comprises a material selected from the group consisting of: titanium nitride, titanium, and aluminum.

3. The method of claim 1 wherein said semiconductor device further comprises a metal oxide semiconductor field electrical transistor (MOSFET) formed on said substrate, said MOSFET and said TMBS in combination comprising a monolithically integrated structure.

4. The method of claim 3 further comprising:
    forming a plurality of second trenches within said substrate, wherein said conductive material is also deposited within said second trenches;
    forming p-body implants between said second trenches, wherein said source metal layer is disposed over a second region comprising said second trenches and said p-body implants;

forming source implants adjacent to each of said second trenches but separated from said conductive material in said second trenches by said insulating material; and forming a second electrical contact between said conductive material in said second trenches and a gate metal, wherein said second electrical contact is outside of said second region.

5. The method of claim 1 further comprising, prior to said forming of said source metal layer:

forming a dielectric layer over said mesas and said first trenches;

etching away portions of said dielectric layer and exposing said mesas so that said source metal layer is in contact with said mesas when said source metal layer is subsequently formed, wherein said insulating material remains over said conductive material after said etching is performed.

6. The method of claim 5 wherein said dielectric layer comprises a dielectric stack comprising a layer of tetraethylorthosilicate (TEOS) and a layer of borophosphosilicate glass (BPSG).

* * * * *